United States Patent [19]

Mohan et al.

[11] Patent Number: 4,542,470
[45] Date of Patent: Sep. 17, 1985

[54] FREQUENCY DETERMINING AND LOCK-ON SYSTEM

[75] Inventors: William L. Mohan, Barrington Hills; Samuel P. Willits, Lake Barrington, both of Ill.

[73] Assignee: Spartanics, Ltd., Rolling Meadows, Ill.

[21] Appl. No.: 631,334

[22] Filed: Jul. 16, 1984

[51] Int. Cl.⁴ .............. G06M 9/00; G01R 23/00; G01R 29/00
[52] U.S. Cl. .................. 364/485; 364/571; 324/77 A; 375/10; 455/226; 377/8
[58] Field of Search .............. 364/485, 571; 375/10; 455/147, 161, 226; 324/77 A; 377/8

[56] References Cited

U.S. PATENT DOCUMENTS

| | | | |
|---|---|---|---|
| 3,641,515 | 2/1972 | Sues | 364/485 |
| 4,372,166 | 2/1983 | Loveland | 364/471 |
| 4,408,284 | 10/1983 | Kijesky | 364/485 |
| 4,471,445 | 9/1984 | Pernick | 364/485 |

Primary Examiner—John S. Heyman
Attorney, Agent, or Firm—Jacque L. Meister

[57] ABSTRACT

An apparatus for automatically determining the predominant frequency of an unknown signal occurring in a known frequency spectrum that is many times larger than the unknown signal. The system searches the known frequency spectrum, determines and locks on to the one useful frequency that results in closed loop servo operation about the single stable null point which matches the unknown signal frequency. The lock-on occurs when a validation signal is generated based on the vector sum of two time delayed signals that are filtered reconstructions of the unknown signal. When this technique is applied to counting plural stacked objects using the apparatus of U.S. Pat. No. 4,373,135, it is possible to accomodate large mis-settings of velocity and sensor width.

19 Claims, 8 Drawing Figures

FREQUENCY DETERMINING AND LOCK-ON SYSTEM

BACKGROUND OF INVENTION

This invention relates generally to means for automatically determining the predominant frequency of a unique but unknown time varying signal over a large frequency spectrum containing the unknown predominant frequency. More particularly, the invention relates to apparatus and a method for searching a broad frequency spectrum to determine and verify the predominant unique unknown frequency.

In systems where the signal output of a variable frequency oscillator is intended to find, track and lock-on to both the phase and frequency of a predominant unknown second signal, it is a system requirement that an error control signal be developed that is proportional to the phase displacement between the two signals to enable adjustment of the oscillator output signal to effect the lock-on and tracking. If the predominant frequency of the second signal is basically unknown, complications arise because of the possible presence of ambiguities caused by the many seemingly stable nulls at harmonics and sub-harmonics of the oscillator output signal. Under such conditions, recognition of the correct phase and frequency of the second signal becomes very difficult to automate.

While the need for automating such a system is present in many applications, the need is readily apparent when one considers the need for pitch matching more or less exactly, the effective width of a scanning sensor to the pitch of plural stacked material to be counted by the article counting apparatus disclosed by WILLIAM L. MOHAN, et al in U.S. Pat. No. 4,373,135, issued Feb. 8, 1983 and by SAMUEL P. WILLITS, et al in U.S. Pat. No. RE27869 issued Jan. 1, 1974. The improvements of this invention are particularly useful when applied to means for effecting a substantially exact pitch match of effective sensor width to the pitch of a plurality of substantially identical objects stacked adjacent one another to achieve the equivalent of either a single-line pair or multiple-line pair sensor arrays effectively pitch matched.

In both of the aforementioned patents, the importance of maintaining a particular relationship between the sensor arrays effective width and stacked object thickness was explained and means were described for signal enhancement for conditions of low signal amplitude such as occur where low contrast gradients between adjacent stacked objects are encountered. While the apparatus of the MOHAN, et al patent, succeeded in overcoming many of the limitations of the earlier WILLITS, et al patent, the resulting system was still subject to counting errors when an operator incorrectly adjusted the system input parameter relating to object width by more than approximately fifty percent either over or under. For input errors that were less than such a 2:1 range, the compensation achieved by the pitch match and velocity correcting systems of the MOHAN, et al, invention provided adequate correction but, that invention has no systems to correct for input errors in excess of that approximate 2:1 limit on the range of input pitch data. Mismatch errors are frequently encountered and particularly where set-in values are left to human judgment rather than actual measurement, automatic correction of such errors is desirable and often necessary.

SUMMARY OF THE INVENTION

A principal object of the invention is to provide a new and improved system for automatically determining the predominant frequency of a unique unknown time varying signal over a large frequency spectrum.

Still another object of the invention is to provide a new and improved system for validating the determination of the predominant unknown time varying signal frequency.

Yet another object of the invention is to provide a new and improved stacked object detecting system having means for automatically correcting any error in the pitch match of the sensor array to the pitch match of the stacked objects to be counted over an error range in excess of the 2:1 limit of the prior art.

A still further object of the invention is to provide a new and improved stacked object detecting and counting system capable of automatically determining the pitch of the stacked objects and, in response thereto, adjust effective sensor width to achieve a substantially perfect pitch match for any one of single-line pair or multiple-line pair effective sensor arrays.

The foregoing and other objects of the invention are achieved in the invention through a system that automatically searches through a selected frequency spectrum and determines from the many frequencies encountered, the one useful frequency that results in proper closed loop servo operation about the stable null point which matches the predominant unique unknown time varying signal frequency. This determination is based upon implementation of the discovery of the existance of a validation signal that occurs only close to the predominant useful unknown output frequency. The unique unknown signal is used to generate a family of signals, each time-delayed by a controllable known fixed time to increment with respect to each other. When the vector sum of a first and second signal is larger than the difference therebetween, there exists within this frequency spectrum a validated condition and a validation signal is generated. When this condition occurs, the inventive system initially holds this specific time delay, which is within the 2:1 range necessary for tracking to the null, and then initiates corrective tracking to the specific time delay required for a null. The nature of the invention and its several features and objects will appear more fully from the following description made in connection with the accompanying drawings.

DESCRIPTION OF THE PREFERRED EMBODIMENTS

Figure 1:
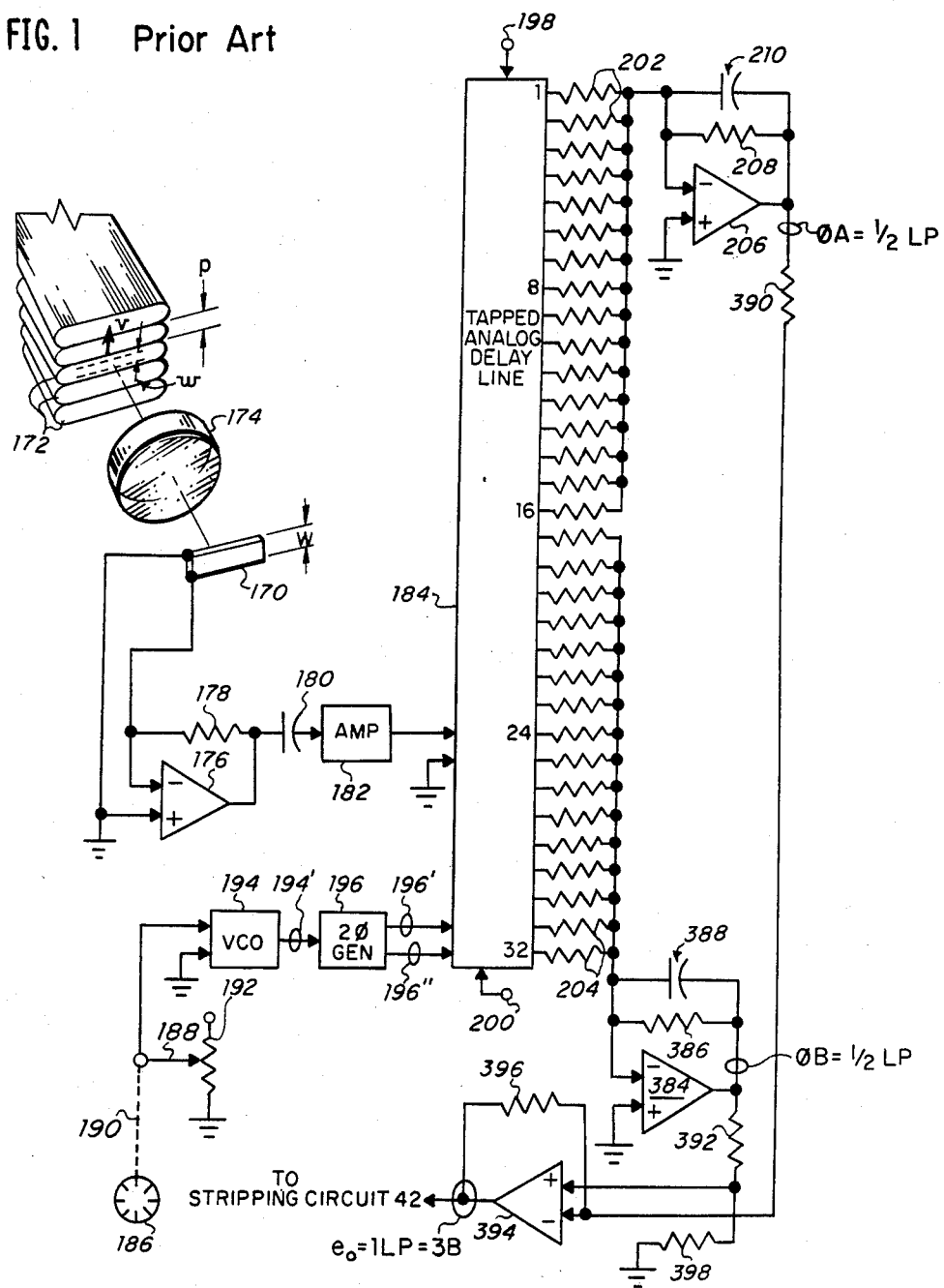
FIG. 1 in perspective and block diagram form shows prior art means for adjusting the effective width of a single narrow sensor using electrical means to effect the adjustment and having as an output the equivalent of a sensor pair electrically connected in push-pull (a so called line pair).
Figure 2:
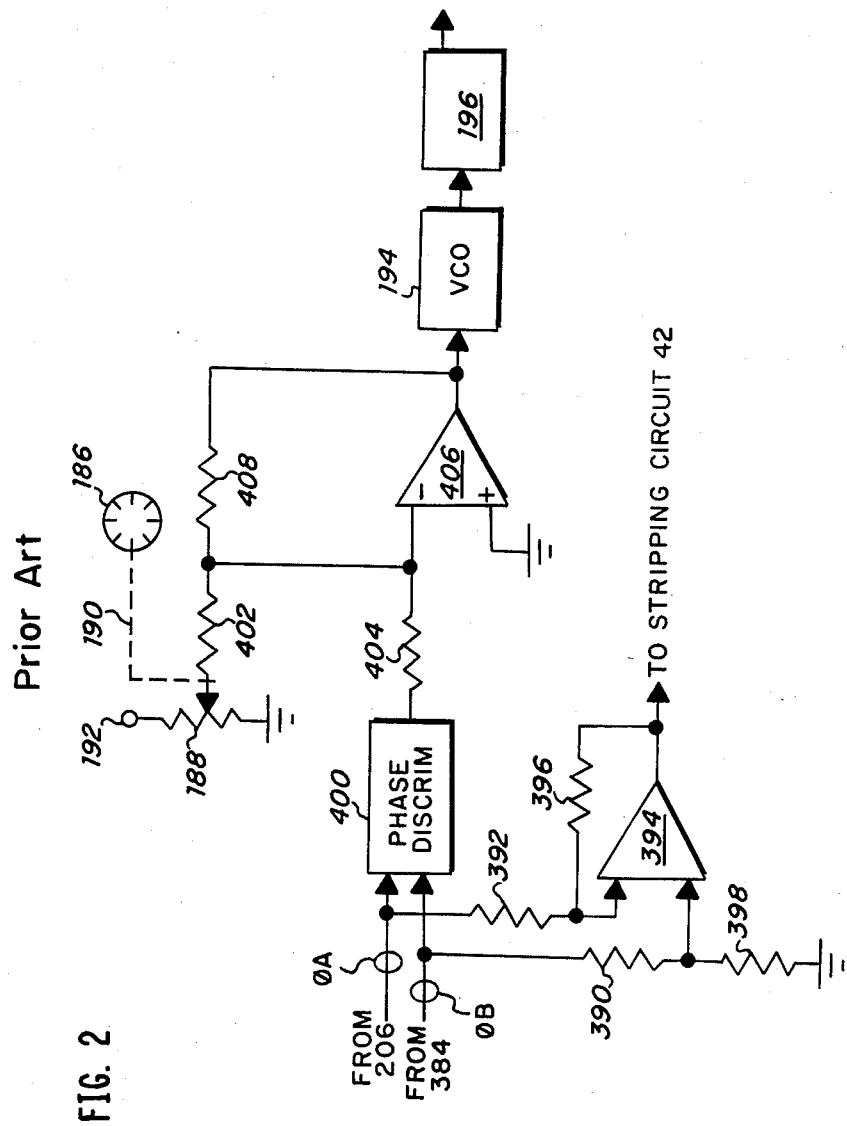
FIG. 2 in schematic and block diagram form illustrates prior art means for automatically correcting pitch match input information.

FIGS. 1 and 2 are illustrative of the prior art system for detecting and counting plural stacked objects using the principals of the aforementioned MOHAN, et al, invention. FIG. 1 is identical to FIG. 13 and FIG. 2 is identical to FIG. 18 of that earlier invention with the exception of the addition of notation locating waveforms shown in FIG. 3. The reference numerals here employed are identical to those of the prior art Mohan, et al invention and the disclosure of that invention should be consulted for a detailed explanation of FIGS. 1 and 2. It is essential to note that the effective width w of the sensor 170 as imaged on the edges of the plural stacked objects is critical and needs to be adjusted as described in the aforesaid WILLITS, et al patent to enhance the second cyclic component in the sensor output signal while simultaneously suppressing the third cyclic component. The second cyclic component is representative of the difference characteristic associated with each object and the third cyclic component being due to plural natural characteristics of each object or noise.

The prior patents discussion of "half-line" output data, "full-line" output data and "two line-pair" data systems were generic descriptive terms applied to spatially matched adjacent sensors, each sensor having an effective width equal to ½ of the pitch of the individual stacked material. Thus, as the sensors traversed the stack, each sensor would generate signal data identical to each other but displaced in time by one-half the wave length of the signal generated at perfect match. Thus, in a "full-line" pair system, each "half-line" pair being displaced by one-half the wave length or 180° in phase, would be differentially summed, as in a conventional "push-pull" signal amplifier to develop an enhanced final A.C. signal output.

Figure 4:
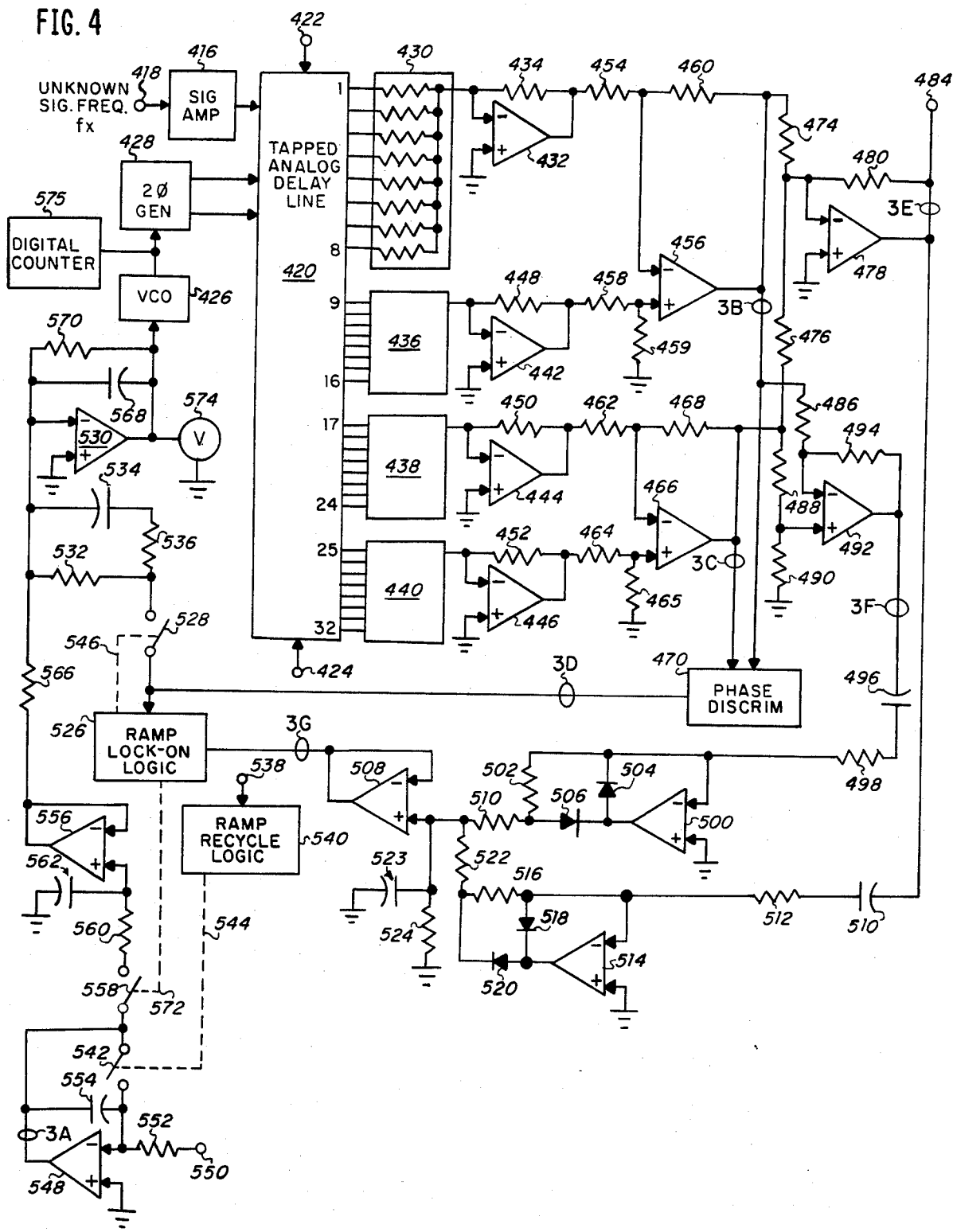
FIG. 4 is a schematic illustration of the preferred invention embodiment with means for determining and validating an unknown input frequency.

The patent of MOHAN, et al, teaches the art of assembling small finite segments of spatial data into the equivalence of the required sensor width to achieve this 180° phase displaced data used for differential summing. Further, this method of finite segmenting and systematic reconstructing can be aplied to any existing known or unknown input signal, as shown in FIG. 4.

As described in both the earlier Willits, et al and Mohan, et al patent, where object contrast is very low, signal characteristics are enhanced and ambiguities resolved by the use of plural sensors each of whose image has an effective width matched to approximately one-half of the pitch p of the objects 172 in the stack. FIG. 1 illustrates the method used in the MOHAN, et al, patent to generate line-pair signal data from a single sensor whose effective width w is very narrow compared to the pitch p. The output of sensor 170, following amplification is coupled to the input of a discrete time processor shown as a charge transfer, multiple output tap, analog delay line 184 where time is quantized while signal output retains its analog value corresponding to a time interval established, in this instance, by voltage controlled oscillator 194 functioning as a variable output clock. The output frequency f of clock oscillator 194 is made to correspond to the pitch match setting of pitch match dial 186 by the setting of a generator shown as potentiometer 188 to which it is mechanically coupled by linkage 190. Because the analog delay line requires 2 complimentary clock signals, 2 phase generator 196 is employed to generate these signals.

The output from tap nodes 1–16 inclusive are summed by hamming 16 resistor bank 202 into amplifier 206, while the outputs from tap nodes 17–32 inclusive are summed by hamming 16 resistor bank 202 into amplifier 384, the outputs of both amplifiers 206 and 384 each being reconstructed half-line sensor output signals with the output of amplifiers 206 and 384 being delayed, the output of amplifier 206 being designated OA and shown at FIG. 3B and amplifier 384's output being designated OB and shown at FIG. 3C. The output of amplifiers 206 and 384 are differentially summed in the circuit comprising resistors 386, 390, 392 and 98 and amplifier 394 with its associated feedback resistor 396. The output of amplifier 394 is shown in FIG. 3B and is then supplied to the input of signal stripping circuit 42 of the prior art WILLITS, et al, patent and subsequently processed for counting in the manner therein described.

The prior art means for electronically effecting the exact pitch match desired are illustrated in FIG. 2. The half-line output data from amplifiers 206 and 384 of FIG. 1 are differentially summed as before by resistors 390, 392 and 398 and amplifier 394 before signal processing in circuit 42 as a preliminary to counting. Additionally, the output of those amplifiers is connected to the input of phase demodulator 400, which generates a positive or negative phase error signal voltage at its output. This error voltage is then summed with the output of potentiometer 188 by resistors 402 and 404 and amplifier 406 to correct any error in the setting of potentiometer 188. This adjustment recorrects the frequency at the output of clock oscillator 194 which reduces the phase error at the output of discriminator 400 to zero as would be achieved for a perfect setting of pitch match dial 188.

While the foregoing system corrects any phase error, it is only effective over a very limited range of pitch match dial missetting. Depending on system parameters, the range of effective pitch match correction is limited to some value less than a factor of two of the set-in value of pitch Beyond that range, the system is unable to determine the correct match because of the appearance of plural nulls at harmonics and sub-harmonics of phase discriminator 400's output signal.

It is a special feature of the invention that the ambiguities present when the system of FIG. 2 is used to scan a pitch-match error range in excess of 2:1 can be eliminated by employment of a unique discovery embodied in the system circuitry of FIG. 4, the principal invention embodiment and one especially useful for enhancement of weak or noise encumbered signal inputs. If the input signal at terminal 418 were from a sensor used for counting stacked material such as sensor 170 in FIG. 1, the system of FIG. 4 would be designated as a two line-pair system; that is, the synthesized or reconstructed output signals would be the same as those at the output of the sensor array of FIG. 6 of the Willits, et al, patent or at the input to amplifier 364 of FIG. 11 of the Mohan, et al patent. The FIG. 4 circuitry automatically searches through a selected frequency spectrum and determines the one frequency that results in the stable null point which matches the predominant sensor output frequency. The determination of the one frequency is based upon the discovery of a unique property of a time delayed replica signal.

As shown in FIG. 4, an unknown signal frequency is applied to terminal 418. The unknown signal is then coupled to signal amplifier 416 whose output is, in turn, coupled to the input of tapped analog delay line 420. As described in the earlier Mohan, et al patent, the delay line, functions as a discrete time processor with time quantized corresponding to a time interval determined by voltage controlled oscillator 426 which functions as a clock. The clock output is divided into the 2 complementary square wave inputs required by the delay line by 2 phase generator 428 while input bias to the delay line is provided at terminals 422 and 424.

As shown in FIG. 4, a replica of the unknown signal is generated by delay line 420 at each of its output tap nodes. These replica signals are identical to the unknown signal applied at system input terminal 418 but sequentially time delayed. The replica signals at tap nodes 1-8 are coupled through resistor bank 430 to operational amplifier 432 with its associated feedback resistor 434 to form a reconstructed signal. The reconstructed signal is the sampled time-delayed filtered original unknown signal. Similarly the outputs of tap nodes 9-16 are the input to resistor bank shown schematically as 436, tap nodes 17-24 are the input to resistor bank 438 and tap nodes 25-32 are the input to resistor bank 440. The summed outputs at each of these resistor banks is the input to a separate operational amplifier with associated feedback resistor to form further reconstructed signals; operational amplifiers 442, 444 and 446 being connected respectively to resistor banks 436, 438 and 440; the respective feed back resistors being 448, 450 and 452.

The output of amplifier 432 is coupled through resistor 454 to operational amplifier 456 and from amplifier 442 through resistor 458 to amplifier 456 with its associated resistors 458 to amplifier 456 with its associated resistors 459 and 460 to form a composite output signal. Similarly, the outputs of amplifiers 444 and 446 are coupled through resistors 462 and 464, respectively, to operational amplifier 466 with its associated resistors 465 and 468 to form a second further delayed composite output signal. The amplitude frequency transfer function at the outputs of operational amplifiers 456 and 466 are depicted by the envelopes of FIG. 3B and 3C respectively. These envelopes were generated using a constantly varying input signal to the delay line over a 40:1 range and a fixed frequency clocking rate as input clock to the two phase generator 428 centered at the $\omega n$ clocking frequency. Where the input signal is an unknown fixed frequency input at 428 and if the clocking rate is varied over the same equivalent 40:1 range, the mirror image of this envelope would be generated with the $\omega n$ being centered at the unknown input frequency.

As with the FIG. 2 prior art embodiment, the output of ampliers 456 and 466 are connected to the input of phase demodulator 470 which generates the positive or negative phase error signal voltages at its output needed for correction of the clock output of voltage controlled oscillator 426. However, as indicated above, the output of demodulator 470 working over a more than 2 to 1 range will contain more than one stable null and it is essential that the system discriminate between the plural false nulls and the one correct null representing the exact frequency of the unknown wanted signal. The output of demodulator 470 is shown at D in FIG. 3 with the true null zero at $\omega n$ and false zeros at $\omega n/2$ and 1.5 $\omega n$. As described below, the invention provides means for validating the true stable null zero and for connecting the output of demodulator 470 to the input of the clock oscillator 426 only when the output signal of the demodulator is valid for tracking.

Where the unknown signal frequency at terminal 418 is that from a sensor used in counting such as sensor 170 in FIG. 1, the outputs of amplifiers 432 and 442 are each the equivalent of the half-line signal data at the output of amplifiers 205 and 384 of FIG. 1 and, when these two outputs are differentially summed through resistors 454 and 458 by operational amplifier 456 they form the equivalent of a full line pair system of FIG. 1. Similarly, the outputs of amplifiers 444 and 446 are also each the equivalent of half-line signal data and when these two outputs are differentially summed through resistors 462 and 464 by operational amplifier 466, they form the equivalent of a second line pair system.

The full line-pair equivalent signals at the outputs of amplifiers 456 and 466 are summed through resistors 474 and 476 by operational amplifier 478 with its associated feedback resistor 480 to form the equivalent signal at that amplifiers output, of a two line-pair system and is passed to terminal 484 for further processing in stripping circuit 42 and counting as described in the aforesaid Willits, et al, patent.

For the purposes of this invention, the outputs of amplifiers 456 and 466 are also differentially summed through resistors 486 and 488 to operational amplifier 492 with its associated feedback resistor 494 and input resistor 490. The summed output of amplifier 478 as a function of a 4:1 spectrum change relative to clocking rate is depicted in FIG. 3E. The differential of the outputs of amplifiers 456 and 466 at the output of amplifier 492 as a function of the above clocking rate relationship is depicted in FIG. 3F.

The output of amplifier 492 is coupled through capacitor 496 and resistor 498 to a first rectifier means comprising amplifier 500 with associated feedback resistor 502 and diodes 505 and 506. The negative output of amplifier 500 is summed and filtered by resistors 510 and 524 and capacitor 523 in amplifier 508. Similarly, the signal at the output of amplifier 478 is coupled through capacitor 510 and resistor 512 to a second rectifier means comprising amplifier 514, feedback resistor 516 and diodes 518 and 520. The positive output of amplifier 514 is summed and filtered by resistors 522 and 524 and capacitor 523 in amplifier 508. The filtered addition of these voltages out of amplifier 508 has the spectrum waveform shown at G in FIG. 3 where the maximum positive value is centered about the natural period, $\omega n$ of the unknown input frequency. This single positive excursion from "U" to "V" of waveform 3G occurs only when the signal at the output of demodulator 470 is valid for a stable null control and the discovery of this condition is a principal feature of the invention. For more selective validation of the signal data at the output of amplifier 508, the required ratio of the output voltage of amplifier 514 to the output voltage of amplifier 500 can be made greater than one by making resistor 522 larger than resistor 510.

The output of amplifier 508 is supplied to the input of ramp lock-on-logic means 526 which also received as an input, the output of demodulator 470. When the output of demodulator 470 first goes from negative and then through zero to positive, while simultaneously the validation output of amplifier 508 is positive, switch 528 is closed by ramp lockon logic 526, thus coupling the output of demodulator 470 to clock-oscillator control amplifier 530 via servo stabilization network comprising capacitor 534, resistors 536 and 532 and reference input resistor 566. The phase error signal at the output of demodulator 470 will then correct the track of voltage controlled oscillator 426 to the incoming unknown predominant signal frequency where clock-oscillator 426 output is held proportional to this unknown frequency. Ramp lock-on logic 526 is coupled to switch 528 by linkage 546. Ramp lock-on logic 526 may be any suitable form of switching means responsive to the aforesaid condition.

The search for the unknown unique frequency is initiated by applying a start signal at input terminal 538 of ramp recycle logic 540 which responds by closing switch 542 to which it is coupled by linkage 544. This results in the generation of a voltage ramp at the output of amplifier 548 whose rate of change, dv/dt, is controlled by the reference voltage applied to terminal 550, resistor 552 and capacitor 554 as shown in FIG. 3A. The particular values for these components and the reference voltage are chosen so that the output of clock oscillator 426 to which the ramp is coupled will change continuously from the lowest frequency multiple expected in the incoming unknown frequency to the highest multiple expected frequency within a prescribed time frame.

The output of ramp generator 548 is coupled to holding voltage amplifier 556 via switch 558, resistor 560 and capacitor 562. Feedback loop 564 insures a low impedance output of holding amplifier 556 high impedance ramp voltage input. The output of holding amplifier 556 is coupled to oscillator servo amplifier 530 through resistor 566 with capacitor 568 and resistor 570 providing appropriate feedback. The varying output of amplifier 530 is coupled to the input of clockoscillator 426 which responds with a continuously changing frequency at its output during the ramping cycle. For stacked material counting applications such as those shown and described in the aforesaid MOHAN et al and WILLITS et al patents and because the signal at input terminal 418 is from a sensor system 170 as shown in FIG. 1, material thickness variations often range between 0.010″ and 0.10″ thick, this would be a 10:1 range change. Of course for other ranges there would be provided an appropriate range change.

Figure 3:
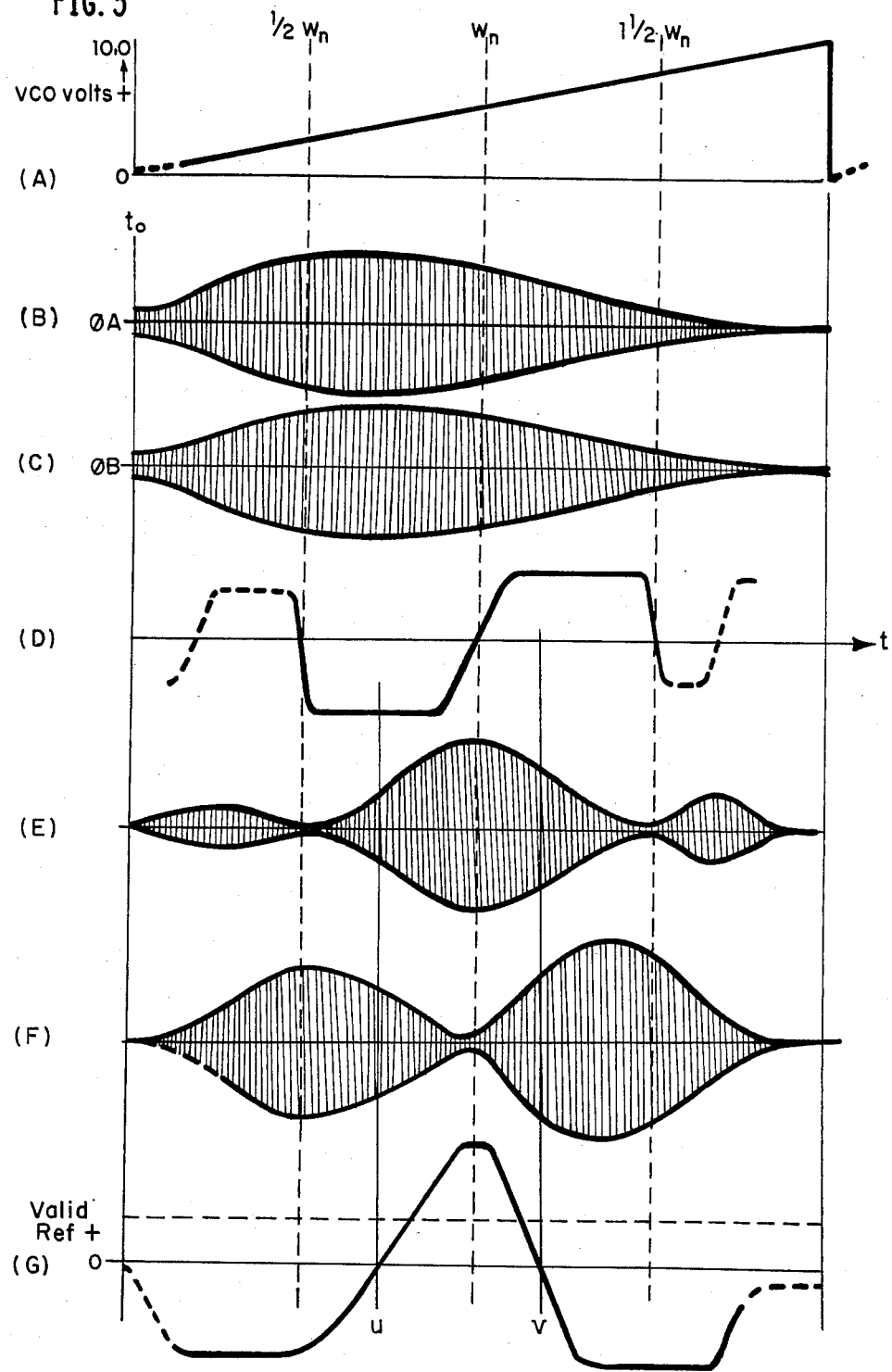
FIG. 3 is a wave form diagram illustrating the waveforms present in various locations in FIGS. 4, 6 and 7.

When the clocking rate at the output of oscillator 426 ramps through a spectrum containing the appropriate multiple of the data rate predominant unknown frequency of the input signal at terminal 418, the outputs of amplifiers 456 and 466 generate the pseudo data signal phase amplitude characteristic as shown in FIG. 3 at B and C. Concurrently the output of phase discriminator 470 and the validation signal data at the output of summing amplifier 508 are being compared in ramp lock-on logic circuit 526 for the existence of the validation condition described above. When this condition exists, switch 528 is closed via linkage 546 thus connecting the output of demodulator 470 to the input of clockoscillator servo amplifier 530 in the manner described above. Simultaneously switch 558 is opened via linkage 572, decoupling the changing ramp voltage at the output of amplifier 548 from the input of holding amplifier 556 which will then hold the value of ramp voltage present immediately before switch 558 opened. With this particular stored value of ramp voltage at the output of holding amplifier 556 as a reference input via resistor 566 to the input of servo-amplifier 530, the clock-oscillator servo amplifier will then correct the phase error signal at the output of demodulator 470 to zero and, hence, to a determination of the exact frequency multiple required for the prescribed sampling rate of the unknown signal at terminal 418. As shown, a meter 574 connected at the output of servo amplifier 530 may be calibrated to provide an analog indication of the frequency of clock-oscillator 426 and hence, the unknown frequency. Similarly a digital counter 575 suitably calibrated, connected at the output of oscillator 426 will give a digital indication of that frequency.

As suggested above, the system of the invention can be used advantageously in stacked material counting applications. For such applications where material thickness or pitch is known only approximately or not at all, application of a start signal at terminal 538 would initiate a "search" cycle to determine the exact unknown input frequency as the scanning sensor moves relative to the stacked material. Once that frequency (and hence material thickness) has been determined, the system will initiate a count. While not shown, obviously the closing of switch 528 by recycle logic 526, could be used to indicate to the counting sub-system that valid data is available for counting and, hence, initiate the count.

Figure 6:
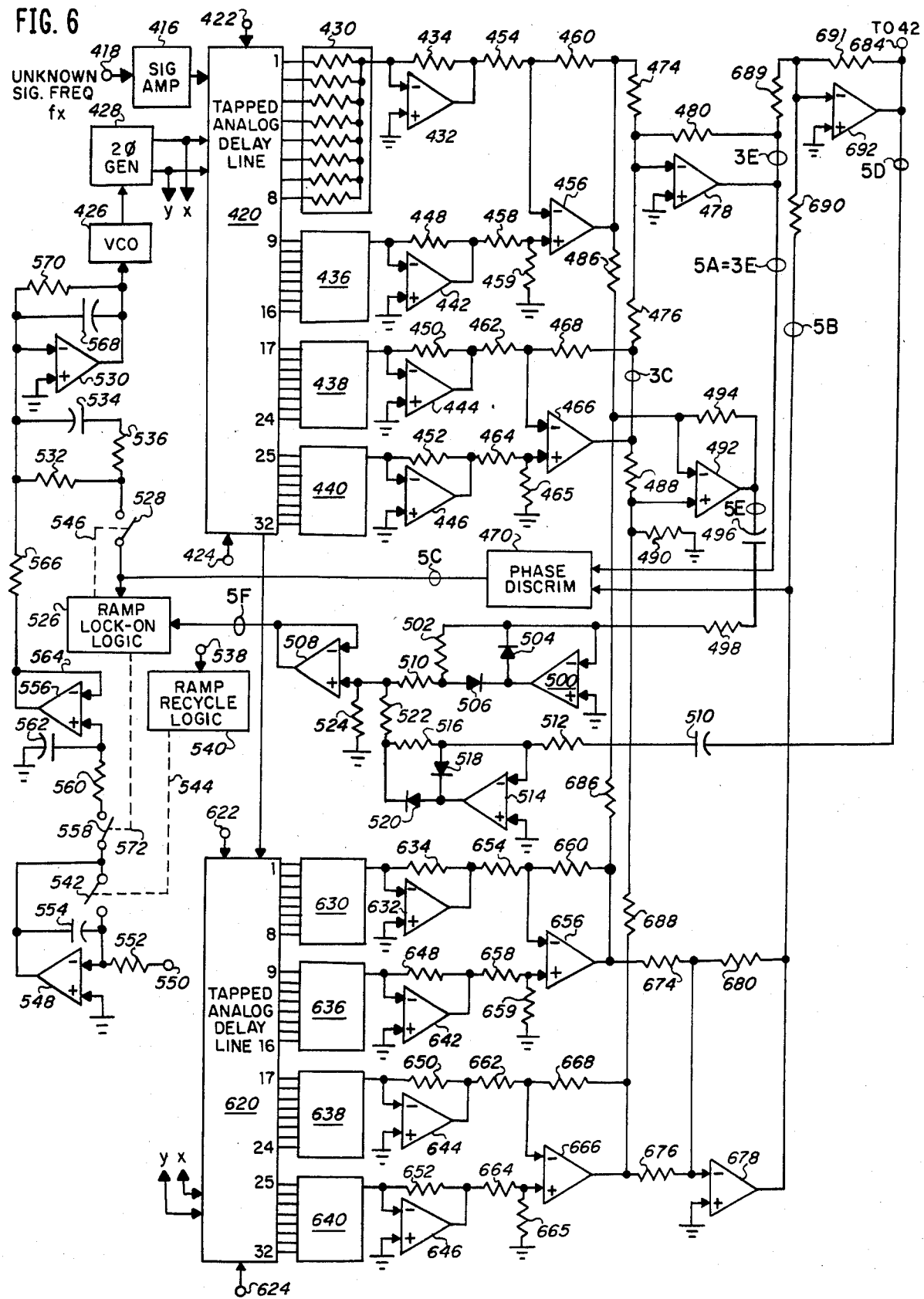
FIG. 6 is a schematic illustration of an inventive embodiment with enhanced means for determining and validating an unknown input frequency.

FIG. 6 illustrates a further inventive embodiment suitable for still greater enhancement of weak or noise encumbered signal inputs. If the signal at terminal 418 of FIG. 6 were from a sensor used for counting stacked material such as sensor 170 in FIG. 1, the system of FIG. 6 would be designated as a four line-pair system.

As in FIG. 4, the analog delay line 420 along with its associated resistor banks 430, 436, 438, 440 and their associated amplifiers generate synthesized or reconstructed data in the form of ½ line data; then when properly summed, one line pair data and finally, into two line pair data at the output from amplifier 478. The output from amplifier 478 is as shown by either FIG. 3E or 5A.

Figure 5:
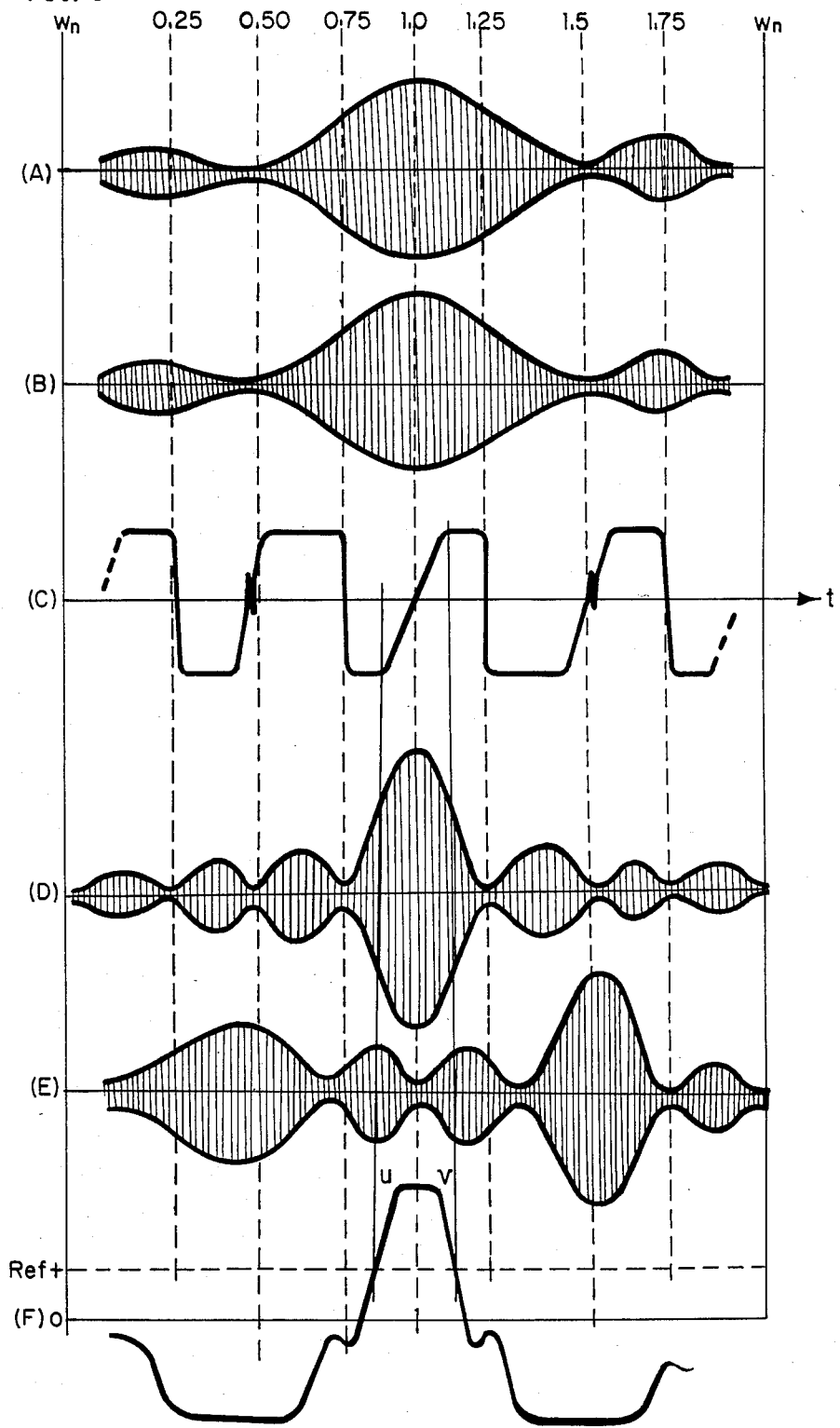
FIG. 5 is a further wave form diagram illustrating the wave forms at various points in the circuitry of FIGS. 4, 6 and 7.

By cascading delay lines as shown in FIG. 6, the "carry-out" signal of first delay line 420 becomes the input signal of second delay line 620. Second delay line 620 with its associated resistor banks 630, 632, 634 and 636 and amplifiers 632, 642, 644 and 646 generate additional synthesized or reconstructed data ½ line-pairs, appropriately delayed and synchronized with first delay line 420 by the common clock input from two-phase generator 428. In a manner similar to that described for FIG. 4, amplifiers 656 and 666 generate line-pair data and two line-pair data appears at the output of amplifier 678. The new two line-pair output of amplifier 678 is further additively summed with the signal data from amplifier 478 in amplifier 692 to give the enhanced four line pair data out of amplifier 692 as shown in FIG. 5D. The output of amplifier 692 at terminal 684 is then utilized for the counting system input to stripping circuit 42 as in the Willits et al patent.

Phase discriminator 470 will now have two line-pair data from amplifier 478 as its first input and two line-pair data from amplifier 678 as its second input. The penalty for this further signal enhancement will be a demodulator output with still a greater number of false nulls, corresponding to the output data signal of FIG. 5D, as shown by FIG. 5C. This will be resolved by the validation signal out of amplifier 508, as shown by FIG. 5F.

The system of FIG. 4 required generating the difference signal needed for validation by taking this difference in amplifier 492 and supplying this as one of the two inputs to be used in amplifier 508 for validation.

The enhanced system of FIG. 6 requires taking the difference of the signals at the outputs of amplifiers 456 and 466, as in the system of FIG. 4, and adding this to the difference of the signals at the outputs of amplifiers 656 and 666. This is accomplished in the differential summing amplifier 492 of FIG. 6 as shown with resistors 686 and 688 corresponding to amplifiers 656 and 666, respectively. This summation of differences at the output of amplifier 492 is shown in FIG. 5E. The ensuing validation signal at the output of amplifier 508 is shown as FIG. 5F.

Still greater data enhancement can be achieved by further cascading of delay lines with the concomitant additive summation of signals for use in validation and signal output, and the addition of the difference of signals, as also required for validation, as practiced in the system of FIG. 6.

However, a visual comparison between FIG. 5D and FIG. 3E, each of which shows a system output signal train, indicates that the more line-pairs of data are added to achieve greater signal enhancement, the narrower the passband characteristic of the final counting data train becomes. Further note in this comparison the enrichment of the number of side lobes as we search through the specific spectrum. This is also true for spatial filtering performed by an optically imaged eight elements pitch matched sensor array, were it employed in the prior pitch match system of either Willits et al or MOHAN, et al.

For all the waveforms involved in the aforementioned system, resistor banks 430, 436, 438, 440, 630, 636, 638 and 640 are so weighted as to provide the so called "Hamming" summation of data as described in the original patent of Mohan et al. For FIG. 6, the summation employed in generating the four separate signals at the inputs of amplifiers 456, 466, 656 and 666 are effectively all of equal value, a so called rectangular weighted summation. For summation of the data of systems utilizing a still greater number of pseudo data signals at the output of amplifiers to increase the enhancement of a noise buried signal, the use of Hamming weighting in the assembly of the amplifier output signals has proven advantageous.

Figure 7:
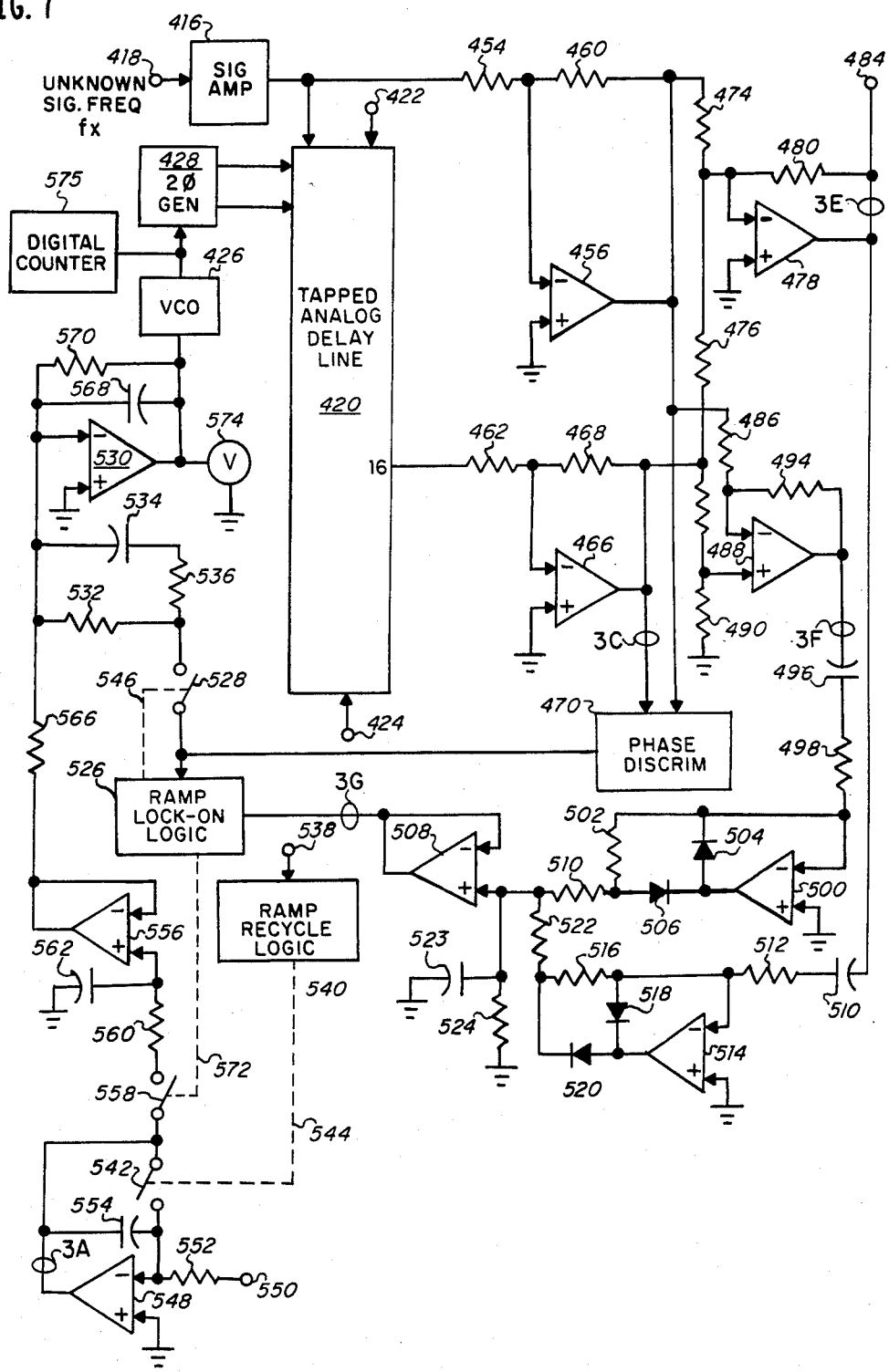
FIG. 7 is similar to FIG. 4 and is a schematic illustration of an invention embodiment with a so-called single line pair output with means to determine and validate sensor output frequency.

FIG. 7 illustrates a further inventive embodiment suitable for use where the signal input at terminal 418 is substantially stronger or less noise encumbered than those at the respective inputs to either the FIG. 4 or FIG. 6 embodiments. If the signal at terminal 418 of FIG. 7 were from a sensor used for counting stacked material such as sensor 170 in FIG. 1, the system of FIG. 7 would be designated as a so-called single line pair system. In FIG. 7, since substantially all of the elements have been shown and described in conjunction with FIGS. 4 and 6, they have been assigned identical reference numerals to those assigned in those Figures and reference to the detailed description of those elements and their function should be made.

In FIG. 7, the output of signal amplifier 416, in addition to providing the input to analog delay line 420, is coupled directly to amplifier 456 through resistor 454 and amplifier 466 is coupled directly to tap node 16 of the delay line 420 via resistor 462. As in the FIG. 4 embodiment, the outputs of amplifiers 456 and 466 are coupled in an identical manner to amplifiers 478 and 492 and phase discrimanator 470 with signal validation being accomplished in a manner identical to that of FIG. 4.

Figure 8:
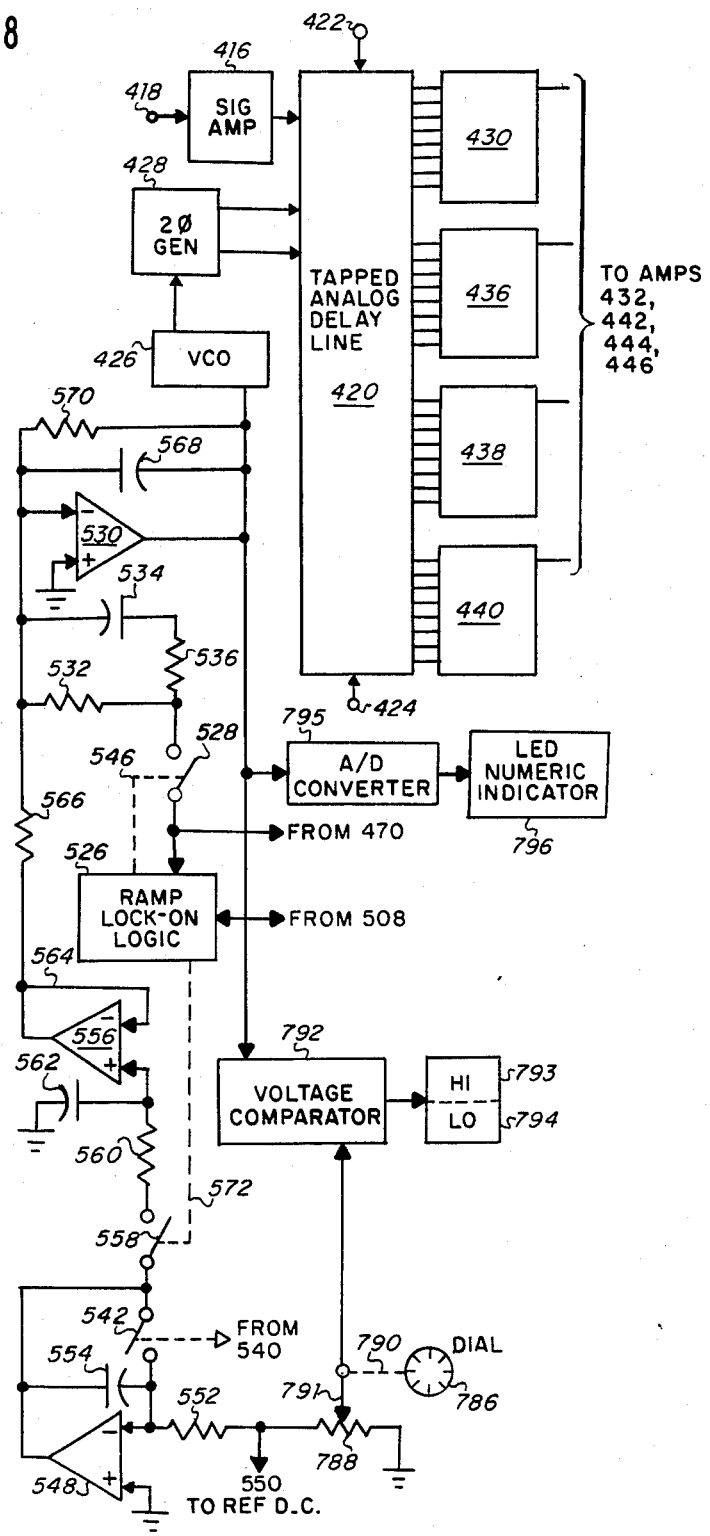
FIG. 8 illustrates an invention embodiment particularly useful with stack-counting apparatus to provide an operator indication of correct pitch match.

FIG. 8 illustrates an inventive subsystem especially useful in a counting system for a plurality of stacked material to provide an operator indication of the correct pitch of the material counted. In FIG. 8, the components that are identical to those of FIG. 4 are assigned reference numerals identical to those of FIG. 4. For description of the function of identical components one should refer to the description of FIG. 4. For drawing simplicity many of the components of FIG. 4 that are identical to those of FIG. 8 are not shown.

In the FIG. 8 embodiment, the reference voltage at the input of the ramp generating amplifier 548 is the same reference voltage as applied to pitch match potentiometer 788, namely that applied to terminal 550. Potentiometer 788 is set by mechanical linkage 790. The pitch match dial, 786, is adjusted to set potentiometer 788 to the pitch match perceived or measured by the operator to be that of each of the plural stacked objects. The output voltage of potentiometer 788, appearing on wiper arm 791, is connected to the input of voltage comparitor 792, which also received as its other input the corrected output of clock servo amplifier 530.

The comparitor compares these two input signals and, using the clock servo amplifier 530 dc output during the counting cycle as a standard, indicates whether the operator's set-in value is too high or too low by illuminating the appropriate one of indicators 793 and 794.

Further, analog-to-digital convertor 795 converts this dc VCO control voltage out of servo amplifier 530 during the count cycle to a numerical presentation of the pitch of the material on LED indicator 799, thus providing useful information to the operator.

In the foregoing description of a system employing tapped analog delay lines for the generation of synthesized or reconstructed, time delayed, signals at its output, various means are described for generating a validation signal when the predominant signal at its input is recognized. These functions are capable of reproduction with a suitably programmed micro-processor and such reproduction is deemed to be within the scope of the invention.

The invention has been described in detail herein with particular reference to preferred embodiments thereof. However, it will be understood that variations and modifications can be effected within the spirit and scope of the invention as described hereinabove and as defined in the appended claims.

What is claimed is:

1. A system for determining and verifying the predominant frequency of a unique unknown time varying signal occurring in a known frequency spectrum comprising
generating means connected at its input to said unique unknown time varying signal and connected and responsive to clock pulses for selectively generating in succession at least four signals each of which is a filtered reconstruction of the unknown signal but time delayed with respect to the preceding reconstructed signal by the same known increment, clock means connected at its output to said generating means and adapted to provide output pulses at a frequency determined by a control signal at its input, variable control signal generating means connected at its output to an input of said clock means to vary the frequency of said clock pulses and thereby said known time delay over a time interval whose period corresponds to the minimum and maximum period of said known frequency spectrum, first summing means connected at its input to said generating means for differentially summing the first two of said successive reconstructed signals to thereby form a first composite signal, second summing means connected at its input to said generating means for differentially summing the second two of said successive reconstructed signals to thereby form a second composite signal, phase demodulator means connected at its input to said first and said second composite signals to generate an output error signal proportional to any phase difference therebetween, first means connected at its input to said first and said second composite signals for determining the amplitude of the sum of the signals therefrom, second means connected at its input to said first and second composite signals for determining the amplitude of the difference of the signals therefrom, validation signal generating means connected at its input to the output of said first and said second means for comparing the amplitude of said sum and difference signals to generate a validation signal when the summed signal is larger, logic means connected at its inputs to said validation signal generating means and said phase demodulator means and at its output to said variable control signal generating means for holding the variable control signal constant at the level present when said validation signal is generated to thereby cause the control signal to remain at the fixed level that identifies the predominant frequency of said unique unknown time varying signal, and means for summing said output error signal and said fixed level control signal to thereby correct for any error in said clock output pulse frequency to make it an exact multiple of said unique unknown time varying signal.

2. A system for determining and verifying the predominant frequency of a unique unknown time varying signal in accord with claim 1 wherein said generating means comprises discrete time processor means.

3. A system for determining and verifying the predominant frequency of a unique unknown time varying signal in accord with claim 1 wherein said generating means comprises multiple output tap analog delay line means with the output of successive taps being sequentially time delayed with respect to the preceding tap.

4. A system for determining and verifying the predominant frequency of a unique unknown time varying signal in accord with claim 3 wherein said generating means further comprises resistor bank means having varied resistance to provide a shaped transfer function, one resistor bank for each reconstructed signal.

5. A system for determining and verifying the predominant frequency of a unique unknown time varying signal in accord with claim 1 wherein said variable control signal generating means comprises ramp generating amplifier means responsive to a reference voltage at its input to generate a controlled voltage ramp whose minimum and maximum levels are controlled to cause the output of said clock means to cycle between the lowest and highest frequency multiple of said known frequency spectrum.

6. A system for determining and verifying the predominant frequency of a unique unknown time varying signal in accord with claim 5 wherein said variable control signal generating means further comprises holding amplifier means connnected between said ramp generating amplifier means and said clock means.

7. A system for determining and verifying the predominant frequency of a unique unknown time varying signal in accord with claim 4 wherein said variable control signal generating means comprises ramp generating amplifier means responsive to a reference voltage at its input to generate a controlled voltage ramp whose minimum and maximum levels are controlled to cause the output of said clock means to cycle between the lowest and highest frequency multiple of said known frequency spectrum and holding amplifier means connected between said ramp generating amplifier means and said clock means.

8. A system for determining and verifying the predominant frequency of a unique unknown time varying signal in accord with claim 4 wherein said first and said second summing means each comprises amplifier means.

9. A system for determining and verifying the predominant frequency of a unique unknown time varying signal in accord with claim 1 wherein said validation signal generating means comprises rectifier means connected at its input to said first and said second means for generating a particular polarity voltage output from said difference signal and an opposite polarity voltage output from said summed signal.

10. A system for determining and verifying the predominant frequency of a unique unknown time varying signal in accord with claim 9 wherein said validation signal generating means further comprises means for summing said opposite polarity voltage outputs of said rectifier means.

11. A system for determining and verifying the predominant frequency of a unique unknown time varying signal occurring in a known frequency spectrum comprising generating means connected at its input to said unique unknown time varying signal and connected and responsive to clock pulses for selectively generating in succession at least eight signals each of which is a reconstruction of the unknown signal but time delayed with respect to the unknown signal or the preceeding reconstructed signal by the same known increment, clock means connected at its output to said generating means and adapted to provide output pulses at a frequency determined by a control signal at its input, variable control signal generating means connected at its output to an input of said clock means to vary the frequency of said clock pulses and said known time delay over a time interval whose period corresponds to the minimum and maximum period of said known frequency spectrum, first summing means connected at its input to said generating means for differentially summing the first two of said successive reconstructed signals to thereby form a first composite signal, second summing means connected at its input to said generating means for differentially summing the second two of said successive reconstructed signals to thereby form a second composite signal, third summing means connected at its input to said generating means for differentially summing the third two of said succesive reconstructed signals to thereby form a third composite signal, fourth summing means connected at its input to said generating means for differentially summing the fourth two of said successive reconstructed signals to thereby form a fourth composite signal, first summing amplifier means connected at its input to said first and said second composite signals for determining the amplitude of the sum of the signals therefrom, second summing amplifier means connected at its input to said third and fourth composite signals for determining the amplitude of the sum of the signals therefrom, differential summing amplifier means connected at its input to said first, second, third and fourth composite signals for determining the amplitude of the difference of the first and second composite signals and adding this to the difference of the third and fourth composite signals, phase demodulator means connected at its input to the outputs of said first and said second summing amplifier means to generate an output error signal proportional to any difference therebetween, validation signal generating means connected at its input to the output of said differential summing amplifier means and said second summing amplifier means for comparing the amplitude of said sum and difference signals to generate a validation signal when the summed signal is larger, logic means connected at its input to said validation signal generating means and said phase demodulator means and at its output to said variable control signal generating means for holding the variable control signal constant at the level present when said validation signal is generated to thereby cause the control signal to remain at the fixed level that identifies the predominant frequency of said unique unknown time varying signal, and means for summing said output error signal and said fixed level control signal to thereby correct for any error in said clock output pulse frequency to make it an exact multiple of said unique unknown time varying signal.

12. A system for determining and verifying the predominant frequency of a unique unknown time varying signal in accord with claim 11 wherein said generating means comprises muiltiple output tap analog delay line means wherein the output of successive taps are sequentially delayed with respect to the preceding tap.

13. A system for determining and verifying the predominant frequency of a unique unknown time varying signal in accord with claim 12 wherein said generating means further comprises resistor bank means having varied resistance to provide a shaped transfer function at its output, one resistor bank for each reconstructed signal.

14. A system for determining and verifying the predominant frequency of a unique unknown time varying signal in accord with claim 11 wherein said variable control signal generating means comprises ramp generating amplifier means responsive to a reference voltage at its input to generate a controlled voltage ramp whose minimum and maximum levels are controlled to cause the output of said clock means to cycle between the lowest and highest frequency multiple of said known frequency spectrum and holding amplifier means connected between said ramp generating amplifier means and said clock means.

15. A system for determining and verifying the predominant frequency of a unique unknown time varying signal in accord with claim 11 wherein said first, second, third and fourth summing means each comprises amplifier means and said validation signal generating means comprises rectifier means connected at its input to said first and said second summing amplifier means for generating a particular voltage output from said difference signal and an opposite polarity voltage output from said summed signal.

16. A system for determining and verifying the predominant frequency of a unique unknown time varying signal in accord with claim 15 wherein said validation signal generating means further comprises means for summing said opposite polarity voltage outputs.

17. A system for determining and verifying the predominant frequency of a unique unknown time varying signal in accord with claim 11 further comprising
adjustable reference voltage source means connected at its input to said reference voltage, and
comparitor means connected at its input to the output of said adjustable reference voltage and to the output of said variable control signal generating means to provide indications of whether said adjustable reference voltage is too high or too low.

18. A system for determining and verifying the predominant frequency of a unique unknown time varying signal occurring in a known frequency spectrum comprising
generating means responsive to a control signal for selectively generating at least one signal which is a replica of the unknown signal, said replica signal being time delayed by a known increment,
variable control signal generating means connected to an input of said generating means to vary the unknown time delay over a time interval whose period corresponds to the minimum and maximum period of said known frequency spectrum,
means connected at its input to said unknown signal and said replica signal for determining the amplitude of the sum of the signals,
means connected at its input to said unknown signal and said replica signal for determining the amplitude of the difference of the signals,
validation signal generating means for comparing the amplitude of said sum and difference signals to generate a validation signal when the summed signal is larger, and
means connected between said validation signal generating means and said variable control signal generating means for holding the variable control signal constant at the fixed level present when said validation signal is generated to thereby identify the predominant frequency of said unique unknown time varying signal.

19. An improved apparatus for counting the quantity of a plurality of similar objects stacked adjacent to another comprising at least one sensor means adapted to generate signals indicative of natural contrast characteristics of individual ones of said similar stacked objects, means for illuminating the edges of said similar stacked objects, means for enabling relative movement between said sensor means and the edges of said similar stacked objects to thereby generate output signals indicative of said quantity, discrete time processor means connected to the output of said sensor means and responsive thereto to synthesize therefrom one or more synthetic output signals at preselected intervals each representative of at least a portion of the output of one or more single sensors sequentially traversing said edges of said similar stacked objects at a fixed scan velocity and each time delayed with respect to the preceding synthetic output signal by the same known increment, clock means to provide output pulses whose frequency is a selected multiple of said sensor means output data frequency, said clock means being connected and responsive to a control signal at its input, and signal processing and counting means responsive to said synthetic output signals to count the number of edges of said similar stacked objects passing before said sensor means, the inprovement comprising variable control signal generating means connected at its output to an input of said clock means to vary the frequency of said clock pulses and thereby said known time delay over a time interval whose period corresponds to the minimum and maximum period of said sensor output signal as it traverses stacked objects in a known overall thickness range, first summing means connected at its input to said discrete time processing means for differentially summing the first two of said successive synthetic output signals to thereby form a first composite signal, second summing means connected at its input to said discrete time processor means for differentially summing the second two of said successive synthetic output signals to thereby form a second composite signal, phase demodulator means connected at its input to said first and said second composite signals to generate an output error signal proportional to any phase difference therebetween, first means connected at its input to said first and said second composite signals for determining the amplitute of the sum of the signals therefrom, second means connected at its input to said first and second composite signals for determining the amplitude of the difference of the signals therefrom, validation signal generating means connected at its input to the output of said first and said second means for comparing the amplitude of said sum and difference signals to generate a validation signal when the summed signal is larger, logic means connected at its inputs to said validation signal generating means and said phase demodulator means and at its output to said variable control signal generating means for holding the variable control signal constant at the level present when said validation signal is generated to thereby cause the control signal to remain at the fixed level that identifies the predominant frequency at the output of said sensor means, and means for summing said output error signal and said fixed level control signal to thereby correct for any error in said clock output pulse frequency to make it an exact multiple of said sensor output signal.

* * * * *